(12) United States Patent
Inomata et al.

(10) Patent No.: US 8,970,749 B2
(45) Date of Patent: Mar. 3, 2015

(54) PHOTOELECTRIC CONVERSION FILM-STACKED SOLID-STATE IMAGING DEVICE WITHOUT MICROLENSES, ITS MANUFACTURING METHOD, AND IMAGING APPARATUS

(75) Inventors: Hiroshi Inomata, Kanagawa (JP); Eiji Watanabe, Miyagi (JP)

(73) Assignee: FUJIFILM Corporation, Tokyo (JP)

( * ) Notice: Subject to any disclaimer, the term of this patent is extended or adjusted under 35 U.S.C. 154(b) by 208 days.

(21) Appl. No.: 13/049,837

(22) Filed: Mar. 16, 2011

(65) Prior Publication Data

US 2011/0228151 A1    Sep. 22, 2011

(30) Foreign Application Priority Data

Mar. 17, 2010 (JP) .................. 2010-061621

(51) Int. Cl.
  H04N 5/335 (2011.01)
  H01L 27/146 (2006.01)
(52) U.S. Cl.
  CPC .... H01L 27/14632 (2013.01); H01L 27/14618 (2013.01)
  USPC ......................................................... 348/294
(58) Field of Classification Search
  CPC .................... H01L 27/14632; H04N 5/2253
  USPC .................................................. 348/273, 294
  See application file for complete search history.

(56) References Cited

U.S. PATENT DOCUMENTS

| 6,649,991 B1 * | 11/2003 | Chen et al. ............... 257/433 |
| 7,445,947 B2 | 11/2008 | Inuiya |
| 7,816,705 B2 * | 10/2010 | Lee et al. ................. 257/99 |
| 7,920,189 B2 | 4/2011 | Goto |
| 2002/0019069 A1 | 2/2002 | Wada |
| 2006/0054987 A1 | 3/2006 | Nii |
| 2007/0045760 A1 * | 3/2007 | Ihama ..................... 257/431 |

(Continued)

FOREIGN PATENT DOCUMENTS

| JP | 2003-031782 A | 1/2003 |
| JP | 2004-063757 A | 2/2004 |

(Continued)

OTHER PUBLICATIONS

An Office Action; "Notice of Reasons for Rejection," issued by the Japanese Patent Office on Sep. 10, 2013, which corresponds to Japanese Patent Application No. 2010-061621 and is related to U.S. Appl. No. 13/049,837; with translation.

*Primary Examiner* — Usman Khan
(74) *Attorney, Agent, or Firm* — Studebaker & Brackett PC

(57) ABSTRACT

There are provided a semiconductor substrate; a photoelectric conversion film stacked on a layer that is disposed on the light incidence side of the semiconductor substrate; signal reading unit formed in a surface portion of the semiconductor substrate, for reading out, as shot image signals, signals corresponding to signal charge amounts detected by the photoelectric conversion film according to incident light quantities; a transparent substrate bonded to a layer that is disposed on the light incidence side of the photoelectric conversion film with a transparent resin as an adhesive; and electric connection terminals which are connected to the signal reading unit by interconnections and which penetrate through the semiconductor substrate and are exposed in a surface, located on the opposite side to the side where the photoelectric conversion film is provided, of the semiconductor substrate.

17 Claims, 10 Drawing Sheets

(56) References Cited

U.S. PATENT DOCUMENTS

| | | | |
|---|---|---|---|
| 2007/0108579 A1* | 5/2007 | Bolken et al. | 257/680 |
| 2007/0202696 A1 | 8/2007 | Inuiya | |
| 2008/0083964 A1 | 4/2008 | Fujimoto et al. | |
| 2008/0225142 A1 | 9/2008 | Goto | |
| 2008/0251872 A1* | 10/2008 | Kwon et al. | 257/432 |
| 2009/0059055 A1 | 3/2009 | Nakano et al. | |
| 2011/0139969 A1 | 6/2011 | Nii | |

FOREIGN PATENT DOCUMENTS

| | | |
|---|---|---|
| JP | 2006-100766 A | 4/2006 |
| JP | 2007-134735 A | 5/2007 |
| JP | 2007-227657 A | 9/2007 |
| JP | 2008-085195 A | 4/2008 |
| JP | 2008-092417 A | 4/2008 |
| JP | 2008-263178 A | 10/2008 |
| JP | 04-271909 B2 | 3/2009 |
| JP | 2009-064839 A | 3/2009 |

* cited by examiner

RESIN APPLICATION AND CUTTING

PHOTOELECTRIC CONVERSION FILM-STACKED SOLID-STATE IMAGING DEVICE WITHOUT MICROLENSES, ITS MANUFACTURING METHOD, AND IMAGING APPARATUS

The present application claims priority from Japanese Patent Application No. 2010-061621 filed on Mar. 17, 2010, the entire content of which is incorporated herein by reference.

BACKGROUND OF INVENTION

1. Field of the Invention

The present invention relates to a solid-state imaging device incorporated in an imaging apparatus such as a digital camera. More particularly, the invention relates to a photoelectric conversion film-stacked solid-state imaging device that is configured so as to be suitable for use in an imaging apparatus, as well as its manufacturing method.

2. Description of the Related Art

Solid-state imaging devices have a soft surface because its photodetecting surface is provided with microlenses (top lenses) made of resin or the like and a color filter layer. Therefore, it is necessary to protect the photodetecting surface to prevent formation of scratches and sticking of dust etc. To this end, conventionally, a transparent substrate such as a glass substrate is bonded to the photodetecting surface with adhesive (refer to JP-A-2003-31782 and JP-A-2008-92417).

However, there are some problems relating to the material of the adhesive. In conventional solid-state imaging devices such as CCD image sensors and CMOS image sensors, to increase the efficiency of utilization of incident light, microlenses are disposed over respective photodetecting elements. If adhesive having approximately the same refractive index as the microlenses were applied to the surfaces of the microlenses, no light refraction would occur at the surfaces of the microlenses and the function of the microlenses would be impaired, that is, the microlenses could not condense incident light.

For the above reason, the transparent resin as a material of the adhesive should have a smaller refractive index than the microlenses. Furthermore, the reliability of the adhesive is low unless it is made of a material having a small water absorption coefficient. Required to be small in refractive index and water absorption coefficient, the material of the adhesive needs to be selected from only a small number of options, resulting in a problem of cost increase.

JP-B-4271909 discloses a technique that the entire surfaces of microlenses are not bonded to a transparent substrate with adhesive; instead, gaps are formed between the microlenses and the transparent substrate and the light condensing efficiency of the microlenses is increased utilizing the refractive index of air. However, a manufacturing step of forming gaps is complex and hence is a factor of manufacturing cost increase. There is another problem that the gaps make it difficult to reduce the thickness of the solid-state imaging device.

SUMMARY OF INVENTION

An object of the present invention is to provide a compact and thin solid-state imaging device which does not require gaps as mentioned above because it is of a photoelectric conversion film stack type and not be mounted with microlenses and which enables use, as an adhesive material, of a transparent resin whose refractive index is not subjected to any restrictions, as well as a manufacturing method of such a solid-state imaging device and an imaging apparatus incorporating such a solid-state imaging device.

According to an aspect of the invention, a photoelectric conversion film-stacked solid-state imaging device without microlenses, includes: a semiconductor substrate; a photoelectric conversion film stacked on a layer that is disposed on the light incidence side of the semiconductor substrate; a signal reading unit formed in a surface portion of the semiconductor substrate, for reading out, as shot image signals, signals corresponding to signal charge amounts detected by the photoelectric conversion film according to incident light quantities; a transparent substrate bonded to a layer that is disposed on the light incidence side of the photoelectric conversion film with a transparent resin as an adhesive; and an electric connection terminal which is connected to the signal reading unit by interconnections and which penetrates through the semiconductor substrate and is exposed in a surface, located on the opposite side to the side where the photoelectric conversion film is provided, of the semiconductor substrate.

According to an aspect of the invention, a manufacturing method of a photoelectric conversion film-stacked solid-state imaging device without microlenses having a semiconductor substrate, a photoelectric conversion film stacked on a layer that is disposed on the light incidence side of the semiconductor substrate, and a signal reading unit formed in a surface portion of the semiconductor substrate, for reading out, as shot image signals, signals corresponding to signal charge amounts detected by the photoelectric conversion film according to incident light quantities, includes the steps of: bonding a collective transparent substrate, with a transparent resin, to a layer that is disposed on the light incidence side of a semiconductor wafer which has the same area as the collective transparent substrate and is a collection of plural semiconductor substrates in each of which a photoelectric conversion film and a signal reading unit are formed; and dicing a resulting structure into individual assemblies of a semiconductor substrate and a transparent substrate.

According to an aspect of the invention, a manufacturing method of a photoelectric conversion film-stacked solid-state imaging device without microlenses having a semiconductor substrate, a photoelectric conversion film stacked on a layer that is disposed on the light incidence side of the semiconductor substrate, and a signal reading unit formed in a surface portion of the semiconductor substrate, for reading out, as shot image signals, signals corresponding to signal charge amounts detected by the photoelectric conversion film according to incident light quantities, includes the steps of: bonding transparent substrates, with a transparent resin, to layers that are disposed on the light incidence side of respective non-defective semiconductor substrates of a semiconductor wafer which is a collection of plural semiconductor substrates in each of which a photoelectric conversion film and the signal reading unit are formed; and dicing the semiconductor wafer to produce individual assemblies of a non-defective semiconductor substrate and a transparent substrate.

According to an aspect of the invention, an imaging apparatus includes the hotoelectric conversion film-stacked solid-state imaging device without microlenses according to the above invention.

The invention makes it possible to provide a compact and thin solid-state imaging device in which no gaps need to be formed between a transparent substrate and an imaging device chip because of absence of microlenses, which enables use of a transparent adhesive whose refractive index is not subjected to any restrictions, and which has such a device structure as to be high in mass-productivity and reliability. Furthermore, the invention can miniaturize and increase the reliability of an imaging apparatus incorporating such a solid-state imaging device.

DESCRIPTION OF EXEMPLARY EMBODIMENTS

An embodiment of the present invention will be hereinafter described with reference to the drawings.

Figure 1:
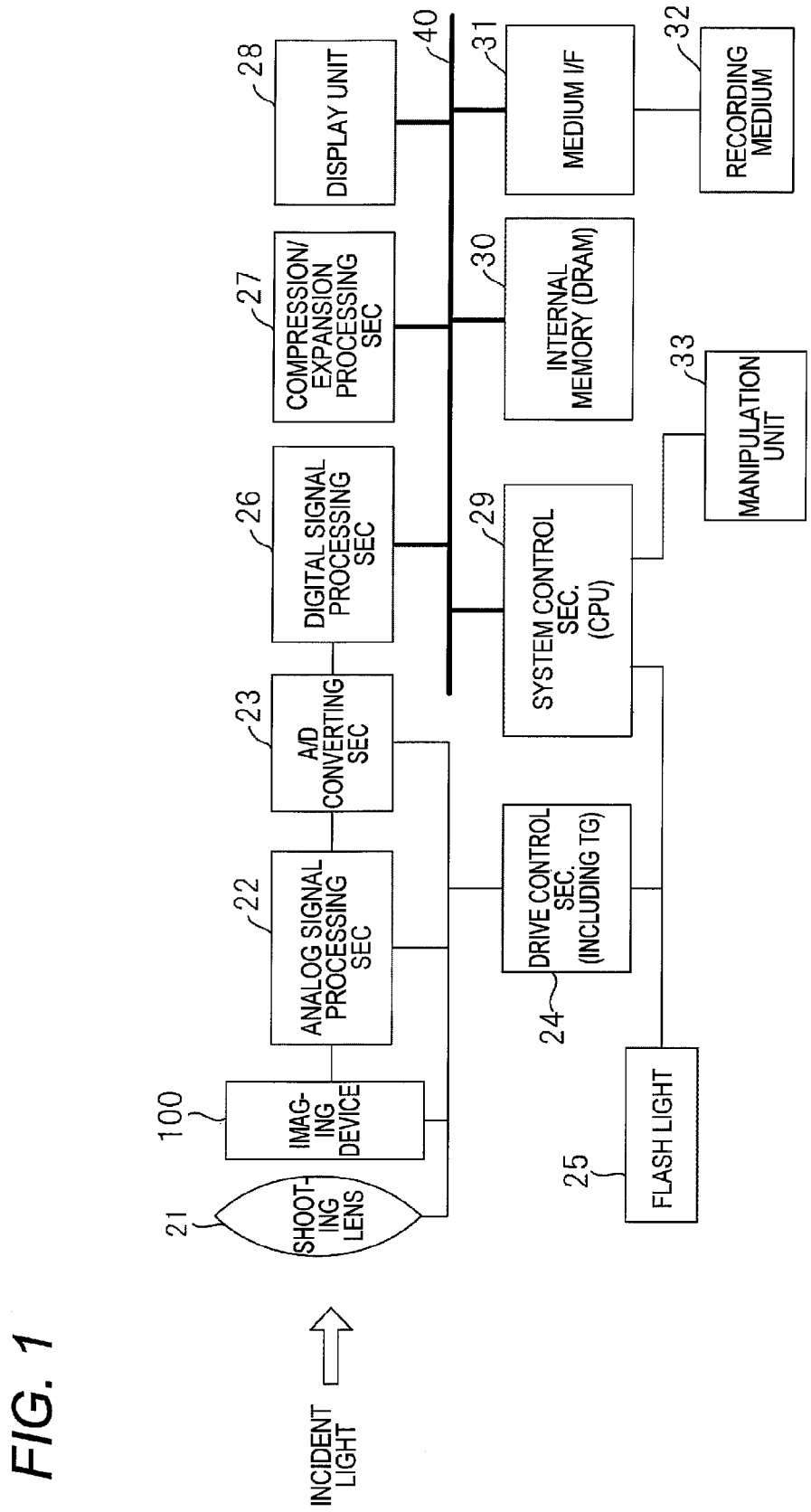
FIG. 1 is a functional block diagram of a digital camera according to an embodiment of the present invention.

FIG. 1 is a block diagram showing the configuration of a digital camera (imaging apparatus) 20 according to the embodiment of the invention. The digital camera 20 is equipped with a solid-state imaging device 100, a shooting lens 21, an analog signal processing section 22 which performs analog processing such as automatic gain control (AGC) and correlated double sampling on analog image data that is output from the solid-state imaging device 100, an analog-to-digital (A/D) converting section 23 which converts analog image data that is output from the analog signal processing section 22 into digital image data, a drive control section (including a timing generator) 24 which drive-controls the shooting lens 21, the A/D-converting section 23, the analog signal processing section 22, and the solid-state imaging device 100 according to an instruction from a system control section (CPU; described later) 29, and a flash light 25 which emits light according to an instruction from the system control section 29.

The digital camera 20 according to the embodiment is also equipped with a digital signal processing section 26 which captures digital image data that is output from the A/D-converting section 23 and performs interpolation processing, white balance correction, RGB/YC conversion processing, etc. on the digital image data, compression/expansion processing section 27 which compresses image data into JPEG or like image data or expands JPEG or like image data, a display unit 28 which displays a menu and the like and also displays a through-the-lens image or a shot image, the system control section (CPU) 29 which supervises the entire digital camera 20, an internal memory 30 such as a frame memory, a medium interface (I/F) section 31 which performs interfacing with a recording medium 32 for storing JPEG or like image data, and a bus 40 which interconnects the above blocks. A manipulation unit 33 which receives a user instruction is connected to the system control section 29.

Figure 2:
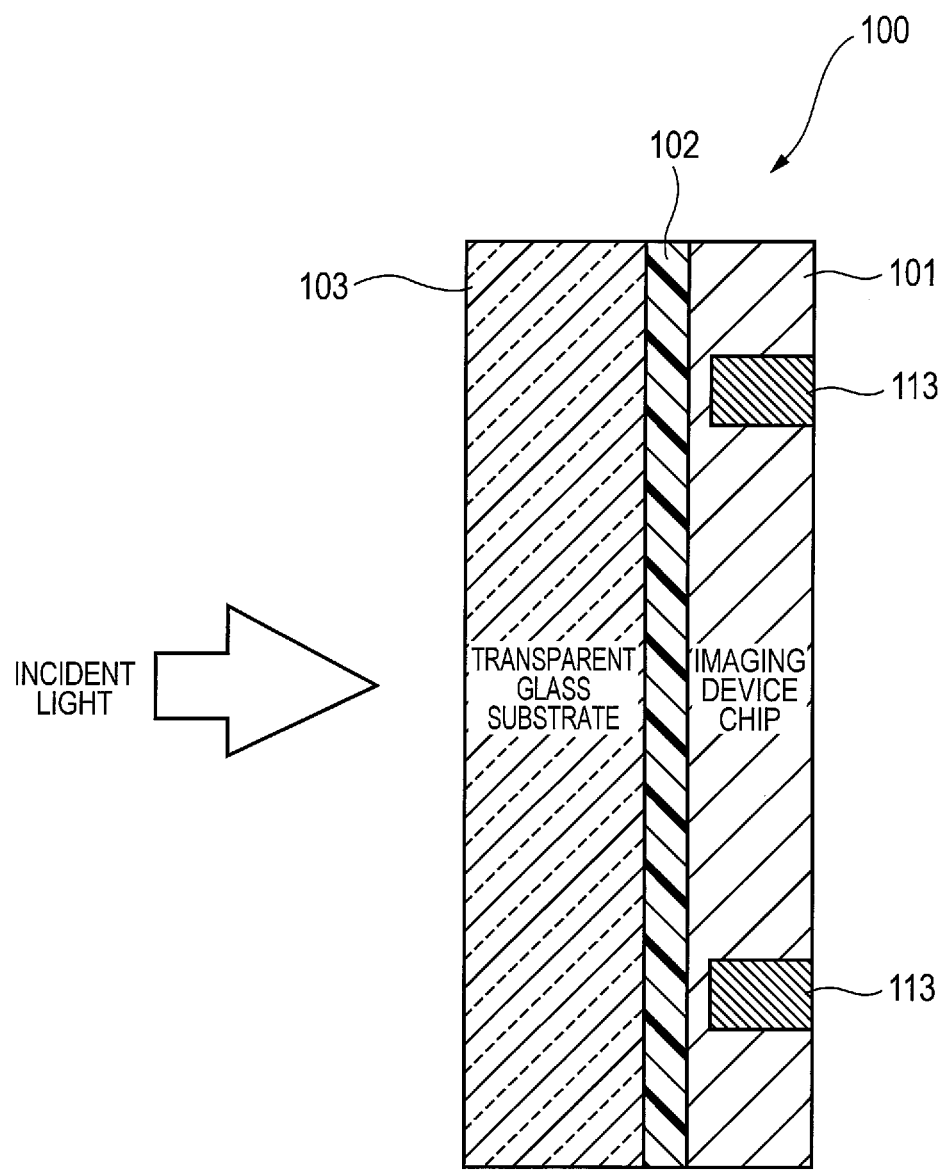
FIG. 2 is a schematic vertical sectional view of a solid-state imaging device shown in FIG. 1.

FIG. 2 is a schematic vertical sectional view of the solid-state imaging device 100 shown in FIG. 1. The solid-state imaging device 100 is composed of an imaging device chip 101, a transparent glass substrate 103 that which is bonded to entire front area of a light incidence side of the imaging device chip 101 with the a transparent resin 102.

In the embodiment, the area of the imaging device chip 101 is equal to that of the transparent glass substrate 103. As described later in detail, electrical connection terminals 113 of the imaging device chip 101 extend through through-holes to the back surface of a semiconductor substrate which is part of the imaging device chip 101. And the back-side exposed portions of the connection terminals (connection pads) 113 are connected to the analog signal processing circuit 22 shown in FIG. 1.

As described above, the solid-state imaging device 100 is compact and thin because it has the simple configuration that the imaging device chip 101 is bonded to the transparent glass substrate 103. Furthermore, the solid-state imaging device 100 according to the embodiment has a complete rectangular parallelepiped shape. Therefore, individual products of the solid-state imaging device 100 can be handled easily, and a large number of products of the solid-state imaging device 100 can be stored and transported easily before shipment from a factory.

The side surfaces of the transparent glass substrate 103, the transparent resin 102, and the imaging device chip 101 may be coated with an optically black paint or the like. Coating with a black paint prevents stray light from shining on the imaging device chip 101 and hence subject images with only little noise can be taken (the same is true of the other embodiments).

In attaching the above-configured solid-state imaging device 100 to the remaining part of the digital camera 20 shown in FIG. 1, it is necessary to accurately position the image-forming plane of the shooting lens 21 with respect to the photodetecting surface of the imaging device chip 101.

Since the solid-state imaging device 100 according to the embodiment is of a photoelectric conversion film stack type and is not mounted with microlenses, this positioning needs to be performed more accurately than in conventional CCD image sensors and CMOS image sensors. If the accuracy of the positioning is not sufficiently high, the solid-state imaging device 100 can take only subject images that are poor in resolution. This positioning is enabled by attaching the solid-state imaging device 100 to the digital camera 20 in such a manner that the surface of the transparent glass substrate 103 is brought into contact with an assembly reference surface (not shown) of the shooting lens 21 side.

Figure 3:
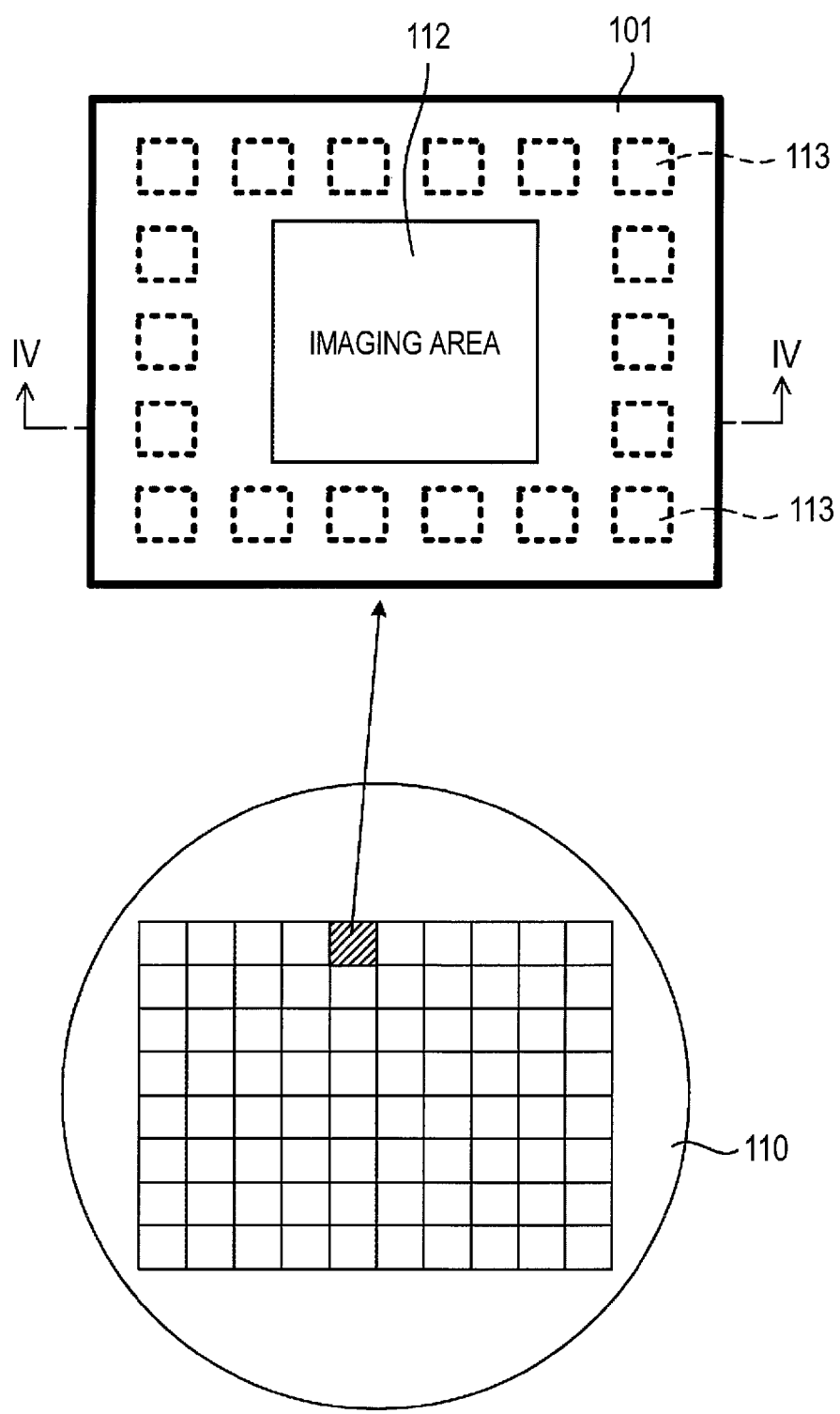
FIG. 3 illustrates a manufacturing process of the solid-state imaging device shown in FIG. 2.

FIG. 3 illustrates a manufacturing process of the imaging device chip 101. A large number of imaging device chips are formed on a semiconductor wafer 110 using semiconductor device manufacturing techniques and film forming techniques and separated into individual imaging device chips 101 by dicing (described later).

Figure 4:
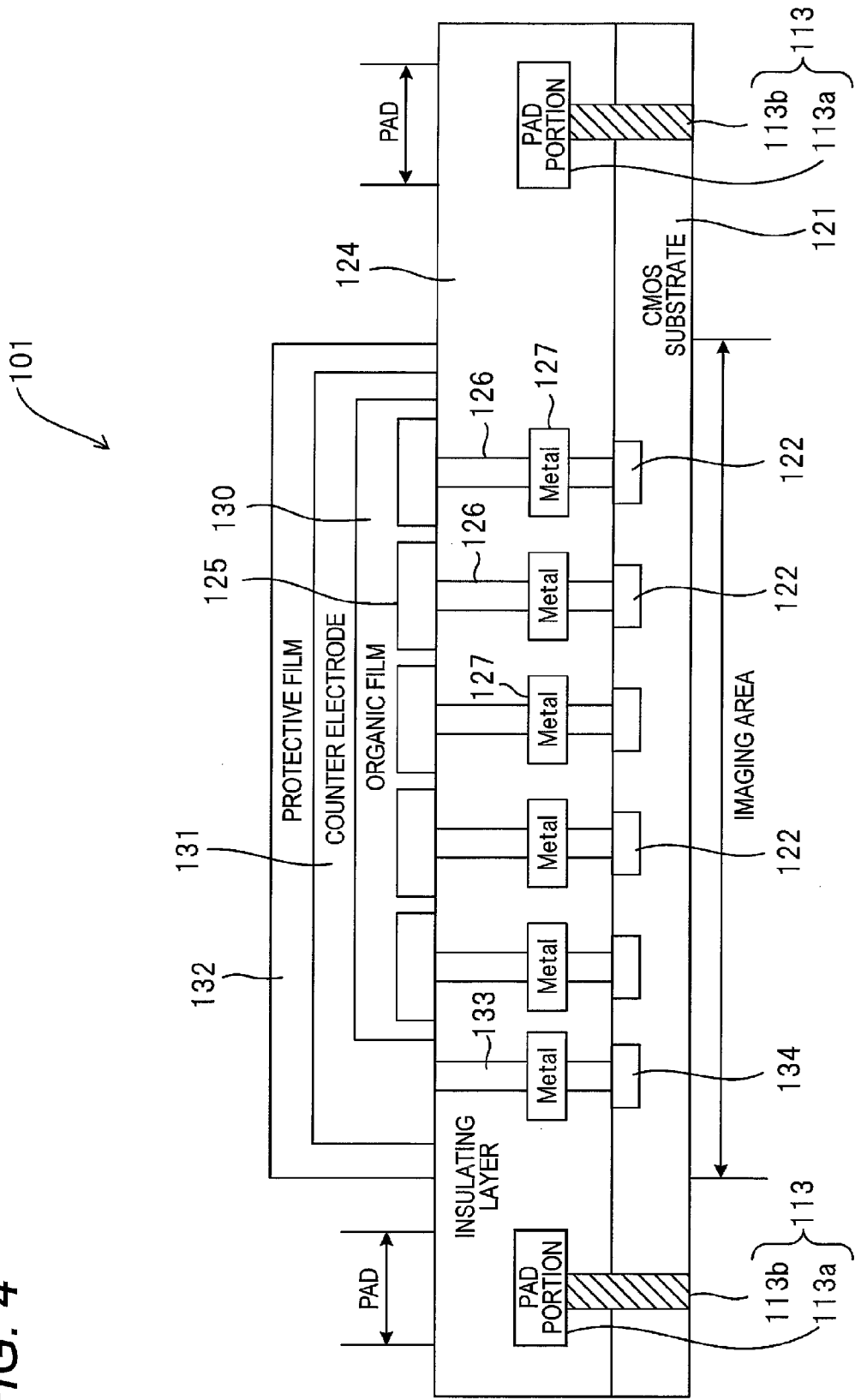
FIG. 4 is a schematic sectional view taken along line IV-IV in FIG. 3.

In each resulting imaging device chip 101 which is rectangular in a top view, a rectangular imaging area 112 is formed at the center and connection pads 113 are formed around it. A transparent glass substrate 103 is bonded to the entire front surface of the imaging device chip 101. As shown in FIG. 4, pad portions 113a are located inside the imaging device chip 101 and metal lines 113b extend from the respective pad portions 113a through the through-holes to the back surface of the imaging device chip 101.

FIG. 4 is a schematic sectional view taken along line IV-IV in FIG. 3. The imaging device chip 101 is formed on a semiconductor substrate 121. Signal charge storage portions 122 corresponding to respective pixels are formed in the semiconductor substrate 121, and signal reading circuits which are MOS transistor circuits (not shown) are formed so as to correspond to the respective pixels as in conventional CMOS image sensors. Each signal reading circuit reads out, as a shot image signal, via the corresponding connection pad 113, a signal that indicates the amount of charge stored in the corresponding signal charge storage portion 122.

An insulating layer 124 is laid on the top surface of the semiconductor substrate 121, and pixel electrode films 125 are arranged like a two-dimensional array in the imaging area 112 so as to correspond the respective pixels. The pixel electrode films 125 are made of a conductive material such as aluminum or indium tin oxide (ITO).

The pixel electrode films 125 are electrically connected to the respective charge storage portions 122 which correspond to the respective pixels via respective via plugs 126 which are formed vertically in the insulating layer 124. Metal films 127 which are separated from each other are buried in the insulating layer 124 at a halfway position and serve to shield the respective charge storage portions 122 from light.

A single photoelectric conversion film 130 is laid on the pixel electrode films 125 over the entire imaging area. In the embodiment, the photoelectric conversion film 130 is an organic film which generates charge corresponding to the amount of incident light. The organic film 130 is made of metallocyanine, phthalocyanine, or 4H-pyran, for example, and is formed at a thickness of about 1.0 µm.

Therefore, if the positioning is performed in the manner described above with reference to FIG. 2 so that the image-forming plane of the shooting lens 21 (see FIG. 1) is located in the organic film 130 which is about 1.0 µm in thickness, a high-resolution subject image can be taken.

A single transparent counter electrode film made of ITO, for example, is laid on the organic film 130 and is covered with a protective film 132. Where the solid-state imaging device 100 is for taking a color image, a layer of Bayer-arranged color filters of R, G, and B (three primary colors) is laid on the protective film 132 (or a planarization layer) and covered with a transparent protective film.

The counter electrode film 131 is connected via a via plug 133 to a high-concentration impurity layer 134 which is formed in the semiconductor substrate 121. A prescribed voltage is applied to the counter electrode film 131 via the high-concentration impurity layer 134, a wiring layer (not shown), and a corresponding connection pad 113.

Each connection pad 113 is composed of a pad portion 113a which is formed in the insulating layer 124 in the same manufacturing step as the metal films 127 are and a metal line 113b which extends from the pad portion 113a to the back surface of the imaging device chip 101 penetrating through the semiconductor substrate 121. Each connection pad 113 is connected to output lines of corresponding signal reading circuits via wiring layers (not shown).

Each metal line 113b is formed by forming a through-hole that penetrates through the semiconductor substrate 121 and reaches the pad portion 113a and filling the through-hole with metal. Since the connection pads 113 are exposed in the back surface of the semiconductor substrate 121, the entire front surface of the imaging device chip 101 can be covered with the transparent glass substrate 103.

In the photoelectric conversion film-stacked solid-state imaging device chip 101 having the above configuration, when light shines on the organic film 130 through the protective film 132 and the counter electrode 131, electron-hole pairs are generated in the organic film 130 in a number corresponding to the amount of the incident light. The holes flow to the counter electrode film 131, and the electrons flow to the pixel electrode films 125 and reach the charge storage portions 122, whereby shot image signals corresponding to the amounts of charges stored in the charge storage portions 122 are read out by the signal reading circuits, respectively.

In the photoelectric conversion film-stacked solid-state imaging device chip 101 in which the signal reading circuits are formed in the lower semiconductor substrate 121, incident light can be received by the entire upper photodetecting surface. Unlike in conventional image sensors, it is not necessary that incident light be condensed by microlenses so as to reach individual photodiodes. Therefore, in selecting a transparent adhesive with which to bond the transparent glass substrate 102 (see FIG. 2) to the protective film 132 (or the protective film formed on the color filter layer), it is not necessary to take into consideration the refractive index of the transparent adhesive. Since a transparent adhesive can be selected with priority given to other factors such as the water absorption coefficient, the reliability of the solid-state imaging device 100 can be increased and a low-cost transparent adhesive can be selected.

Next, a manufacturing method of the above-described imaging device 100 will be described. After a large number of imaging device chips are formed on a semiconductor wafer 110 (see the bottom part of FIG. 3), a circular-plate-like transparent glass substrate 115 having the same area as the semiconductor wafer 110 is bonded to the entire top surface of semiconductor wafer 110 with a transparent resin 102 (adhesive) (see the top part of FIG. 5).

Figure 5:
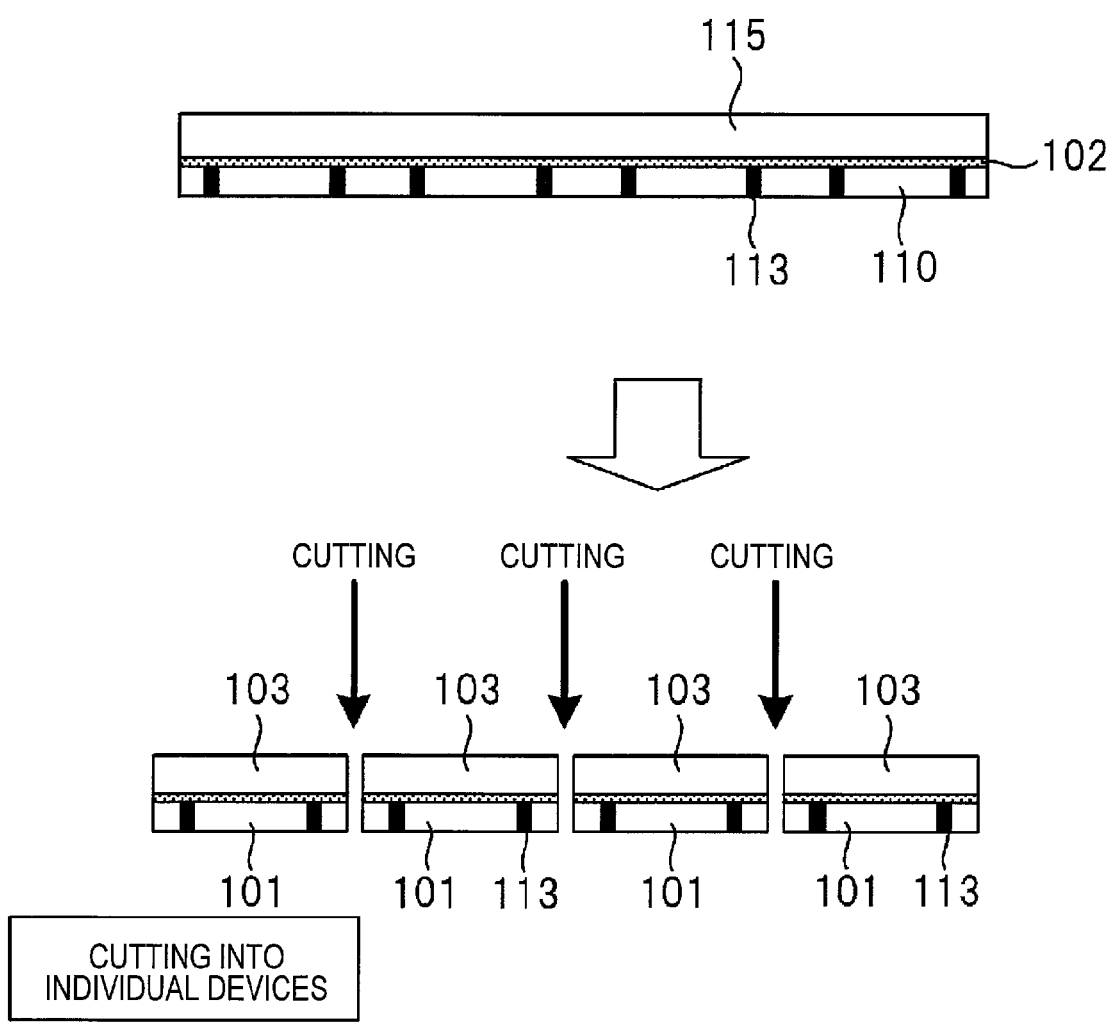
FIG. 5 illustrates the manufacturing process of the solid-state imaging device shown in FIG. 2.

Then, as shown in the bottom part of FIG. 5, individual imaging device chips 101 are separated from each other by dicing, whereby individual solid-state imaging devices 100 are obtained (see FIG. 2). More specifically, the semiconductor wafer 110 is divided into the individual imaging device chips 101 and the transparent glass substrate 115 is divided into individual transparent glass substrates 103.

Figure 6A:
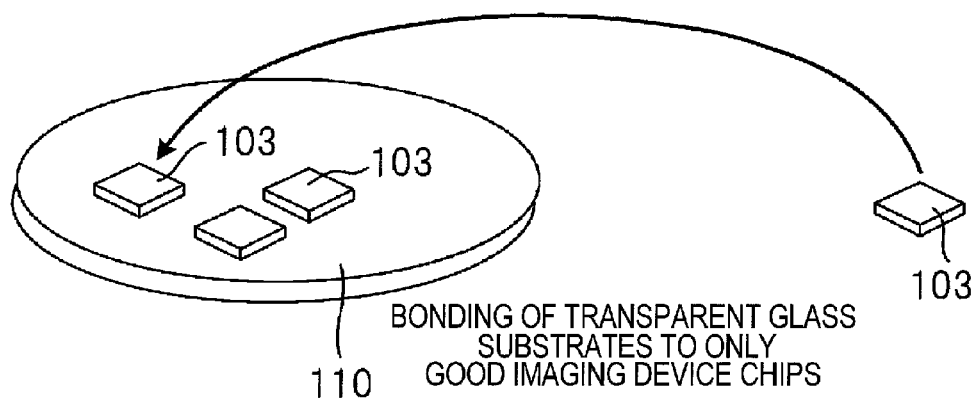
FIGS. 6A-6C illustrates a manufacturing process of a solid-state imaging device according to another embodiment of the invention.
Figure 6B:
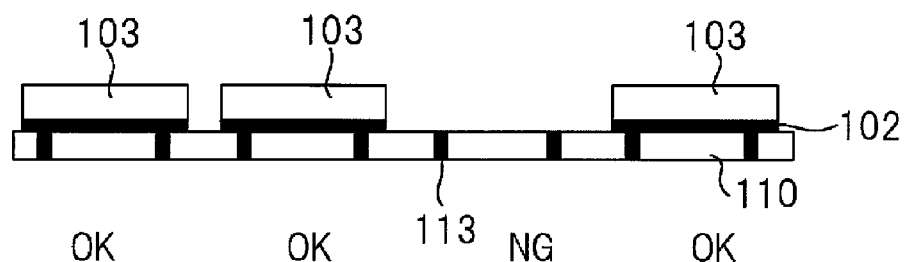
Figure 6C:
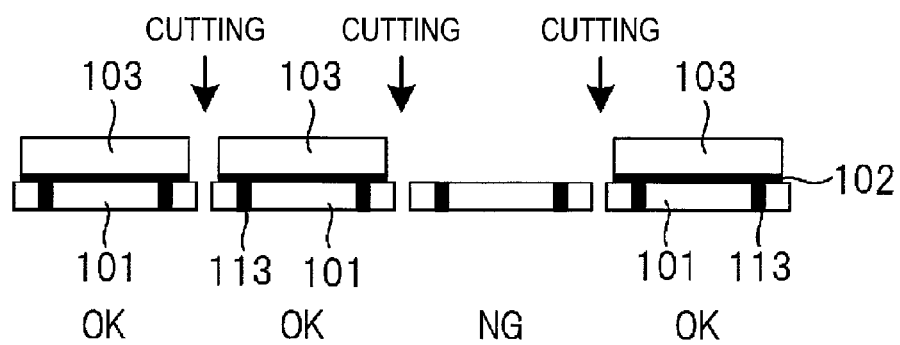

FIGS. 6A-6C illustrate a manufacturing method of a solid-state imaging device 200 according to another embodiment of the invention. Members having the same members in FIG. 2 are given the same reference numerals as the latter and will not be described in detail.

In this embodiment, after a large number of imaging device chips are formed on a semiconductor wafer 110 (see the bottom part of FIG. 3), individual transparent glass substrates 103 are bonded to the top surfaces of good imaging device chips formed on the semiconductor wafer 110, respectively, with a transparent resin 102 (see FIG. 6A). As shown in FIG. 6B, no transparent glass substrates 103 are bonded to defective imaging device chips, the transparent glass substrates 103 serve to mark good ones during manufacture.

Then, as shown in FIG. 6C, dicing is performed to produce individual solid-state imaging devices 200. The dicing may be performed using a dicing blade or laser light.

Figure 7:
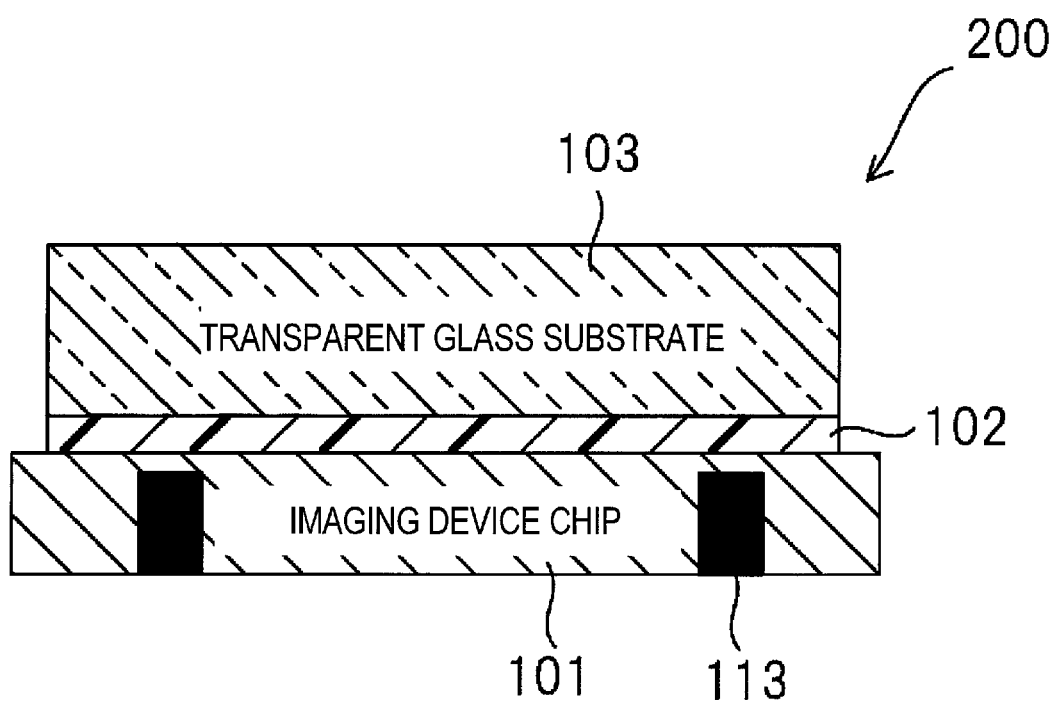
FIG. 7 is a schematic sectional view of a solid-state imaging device manufactured by the manufacturing process of FIGS. 6A-6C.

FIG. 7 is a sectional view of an individual solid-state imaging device 200. Whereas in the solid-state imaging device 100 shown in FIG. 2 the transparent glass substrate 103 has the same area as the imaging device chip 101, in the solid-state imaging device 200 according to this embodiment the area of the transparent glass substrate 103 is a little smaller than that of the imaging device chip 101 because individual transparent glass substrates 103 are bonded to the top surfaces of good imaging device chips.

Also with this configuration, like the solid-state imaging device 100 of FIG. 2, the solid-state imaging device 200 can be made compact and thin and hence can reduce the size and thickness of an imaging apparatus. Furthermore, the material of the transparent resin 102 can be selected from a large number of options, which makes it easy to select a highly reliable one or an inexpensive one.

Figure 8A:
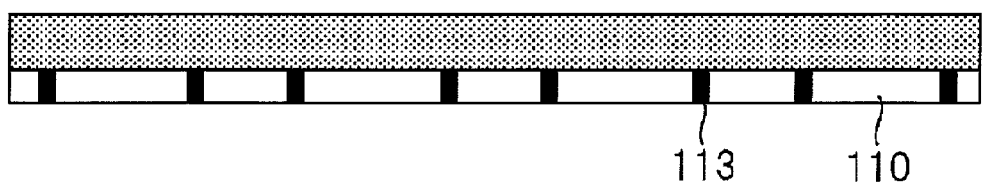
FIGS. 8A and 8B illustrate a manufacturing method of a solid-state imaging device according to still another embodiment of the invention.
Figure 8B:
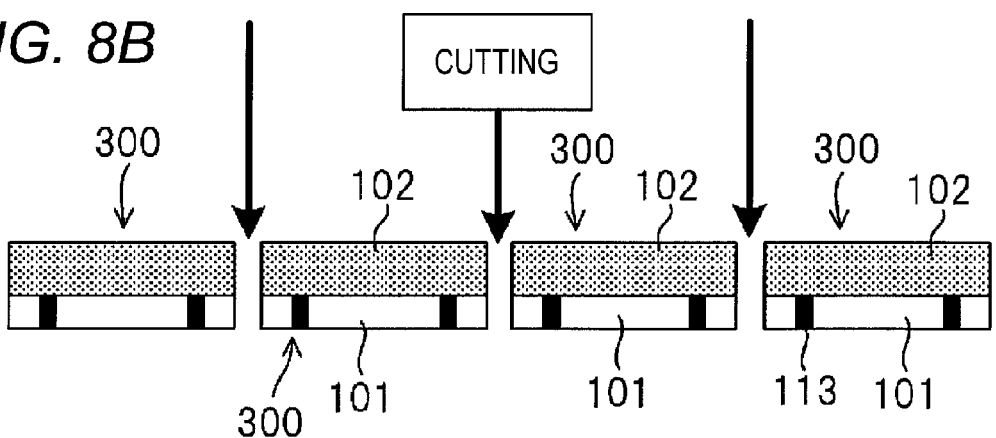
Figure 8C:
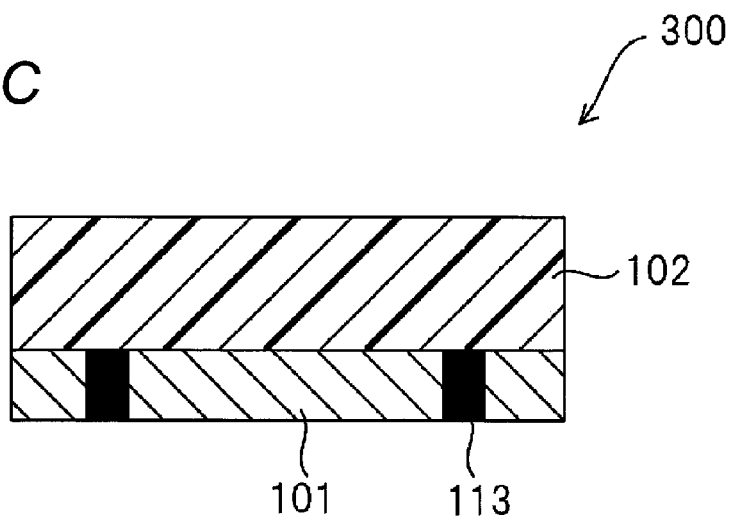
FIG. 8C is a schematic sectional view of a manufactured solid-state imaging device.

FIGS. 8A and 8B illustrate a manufacturing method of a solid-state imaging device 300 according to still another embodiment of the invention. FIG. 8C is a sectional view of an individual solid-state imaging device 300. The solid-state imaging device 300 according to this embodiment is different from the solid-state imaging device 100 of FIG. 2 in that the transparent glass substrate 103 is not used and, instead, the transparent resin 102 is applied thickly.

More specifically, as shown in FIG. 8A, a transparent resin 102 is applied thickly to a semiconductor wafer 110 on which a large number of imaging device chips are formed. After the transparent resin 102 is set, the individual imaging device chips 101 are separated from each other by dicing as shown in FIG. 8B. As a result, each solid-state imaging device 300 shown in FIG. 8C is produced.

In this embodiment, since the thick transparent resin 102 is used instead of the transparent glass substrate 103, it is preferable to select, as the transparent resin 102, a resin that exhibits as high hardness as vitreous substances and hence whose surface is hardly damaged when set.

Figure 9A:
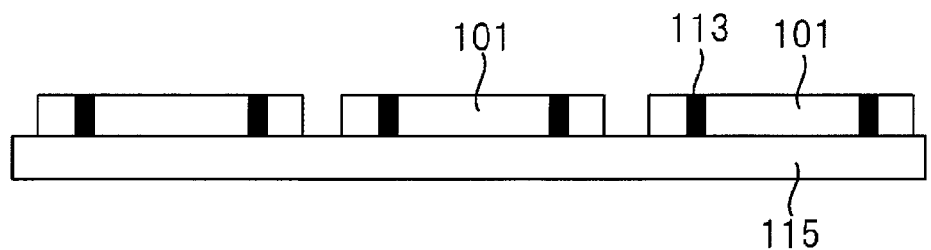
FIGS. 9A and 9B illustrate a manufacturing method of a solid-state imaging device according to yet another embodiment of the invention.
Figure 9B:
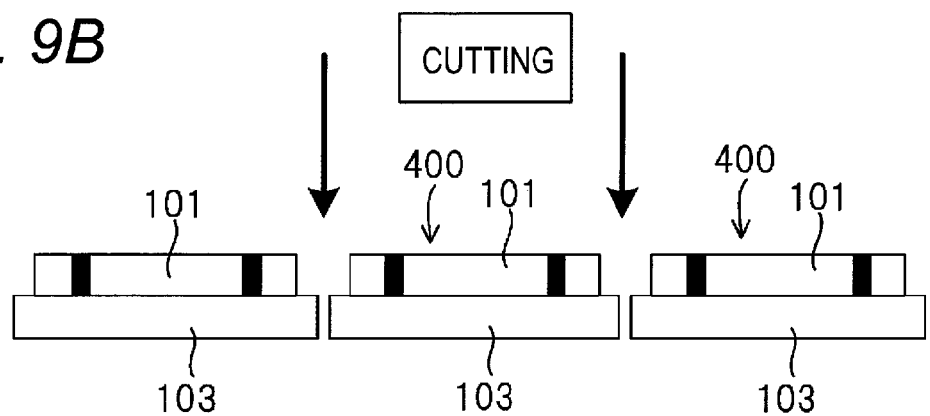
Figure 9C:
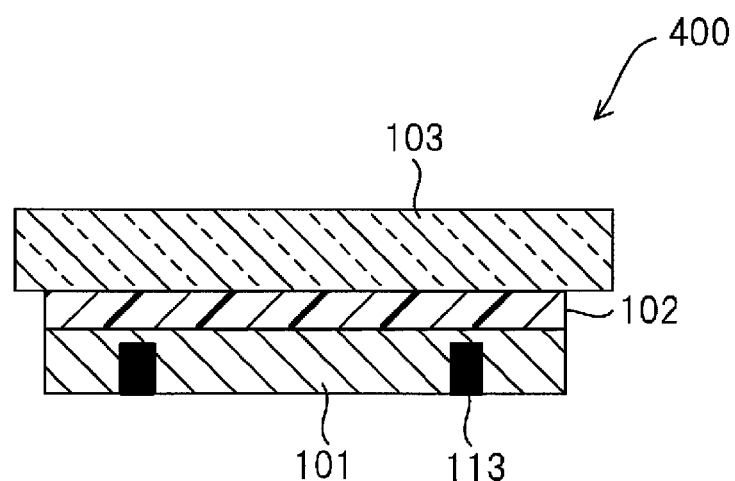
FIG. 9C is a schematic sectional view of a manufactured solid-state imaging device.

FIGS. 9A and 9B illustrate a manufacturing method of a solid-state imaging device 400 according to yet another embodiment of the invention. FIG. 9C is a sectional view of an individual solid-state imaging device 400. In this embodiment, after plural imaging device chips formed on a semiconductor wafer are separated from each other by dicing, only good imaging device chips are selected and bonded to a circular-plate-like transparent glass substrate 115 with a transparent resin 102 (see FIG. 9A).

Then, as shown in FIG. 9B, the transparent glass substrate 115 is diced between the adjoining imaging device chips 101 into individual transparent glass substrates 103. Each solid-state imaging device 400 shown in FIG. 9C is thus produced.

Also with this configuration, as in the solid-state imaging device 100 of FIG. 2, a compact, thin, and highly reliable solid-state imaging device can be obtained.

Figure 10A:
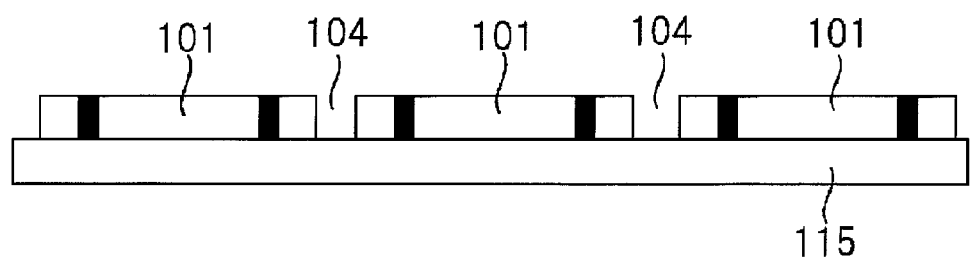
FIGS. 10A and 10B illustrate a manufacturing method of a solid-state imaging device according to a further embodiment of the invention.
Figure 10B:
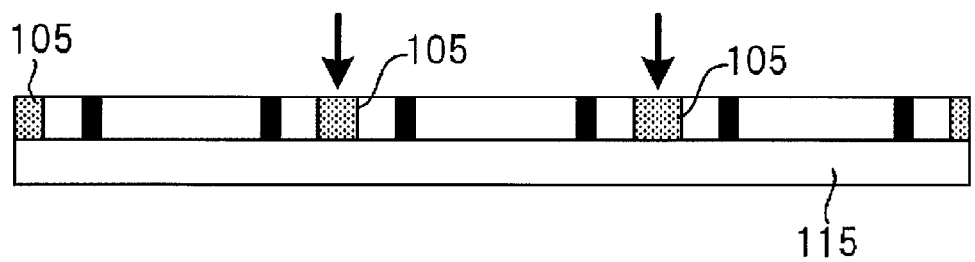
Figure 10C:
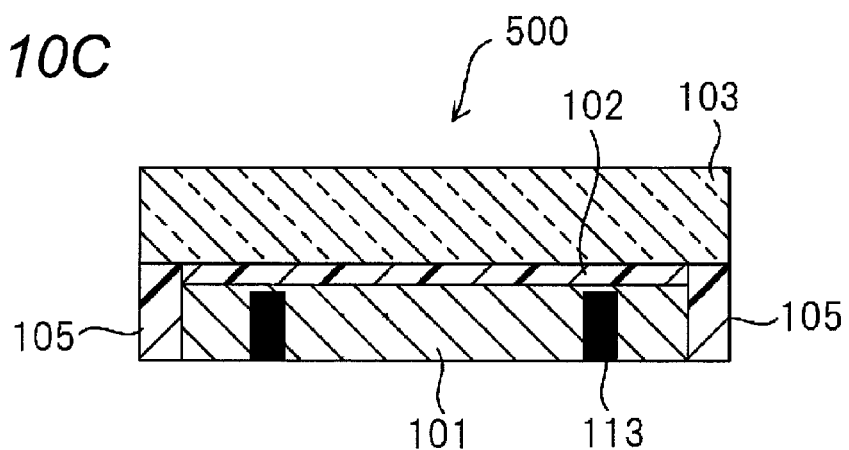
FIG. 10C is a schematic sectional view of a manufactured solid-state imaging device.

FIGS. 10A and 10B illustrate a manufacturing method of a solid-state imaging device 500 according to a further embodiment of the invention. FIG. 10C is a sectional view of an individual solid-state imaging device 500.

The solid-state imaging device 500 according to this embodiment is basically the same as the solid-state imaging device of FIGS. 9A-9C and is different from the latter in the following. When good imaging device chips 101 are bonded to the circular-plate-like transparent glass substrate 115, spaces 104 are formed between the imaging device chips 101 (see FIG. 10A). As shown in FIG. 10B, the spaces 104 are filled with resin 105. It is preferable that the resin 105 be an optically black resin. The black resin 105 can prevent stray light from shining on the imaging device chip 101.

Then, as shown in FIG. 10C, the structure of FIG. 10B is diced at the resin members 105 into individual solid-state imaging devices 500. Since each solid-state imaging device 500 has a complete rectangular parallelepiped shape, it can be handled easily and end portions of the transparent glass substrate 103 are prevented from being damaged.

Also in the embodiment of FIGS. 6A-6C and FIG. 7, naturally, the steps formed by the transparent glass substrate 103 and the imaging device chip 101 may be covered with (the spaces may be filled with) a black resin so that each solid-state imaging device has a complete rectangular parallelepiped shape and thereby chipping of the imaging device chip 101 and entrance of stray light are prevented.

As described above, in each of the solid-state imaging devices 100, 200, 300, 400, and 500 according to the embodiments, the imaging device module is essentially composed of only the transparent glass substrate 103 (or the thick transparent resin 102) and the imaging device chip 101. Therefore, each of the solid-state imaging devices 100, 200, 300, 400, and 500 is thinner as a whole than conventional CCD image sensors and CMOS image sensors, and hence can suitably be incorporated in small electronic apparatus such as an endoscope (in its distal unit) and a cell phone.

As described above, the photoelectric conversion film-stacked solid-state imaging device without microlenses according to the embodiments is characterized by comprising a semiconductor substrate; a photoelectric conversion film stacked on a layer that is disposed on the light incidence side of the semiconductor substrate; signal reading means formed in a surface portion of the semiconductor substrate, for reading out, as shot image signals, signals corresponding to signal charge amounts detected by the photoelectric conversion film according to incident light quantities; a transparent substrate bonded to a layer that is disposed on the light incidence side of the photoelectric conversion film with a transparent resin as an adhesive; and electric connection terminals which are connected to the signal reading means by interconnections and which penetrate through the semiconductor substrate and are exposed in a surface, located on the opposite side to the side where the photoelectric conversion film is provided, of the semiconductor substrate.

The photoelectric conversion film-stacked solid-state imaging device without microlenses according to the embodiments is also characterized in that a distance between a front surface of the transparent substrate and the surface of the semiconductor substrate in which the electric connection terminals are exposed is equal to a total thickness of the solid-state imaging device.

The photoelectric conversion film-stacked solid-state imaging device without microlenses according to one embodiment is characterized in that the transparent substrate and the semiconductor substrate have the same area.

The photoelectric conversion film-stacked solid-state imaging device without microlenses according to another embodiment is characterized in that the transparent resin is made thick to replace the transparent substrate.

The photoelectric conversion film-stacked solid-state imaging device without microlenses according to still another embodiment is characterized in that the transparent substrate has a smaller area than the semiconductor substrate.

The photoelectric conversion film-stacked solid-state imaging device without microlenses according to yet another embodiment is characterized in that the transparent substrate has a larger area than the semiconductor substrate.

The photoelectric conversion film-stacked solid-state imaging device without microlenses according to a further embodiment is characterized in further comprising resin members with which spaces are filled that are adjacent to steps that are formed because of the difference between the areas of the transparent substrate and the semiconductor substrate, whereby the solid-state imaging device has a complete rectangular parallelepiped shape.

The photoelectric conversion film-stacked solid-state imaging device without microlenses according to the embodiments is also characterized in that side surfaces of the solid-state imaging device are coated in black.

The manufacturing method according to one embodiment is directed to a photoelectric conversion film-stacked solid-state imaging device without microlenses having a semiconductor substrate, a photoelectric conversion film stacked on a layer that is disposed on the light incidence side of the semiconductor substrate, and signal reading means formed in a surface portion of the semiconductor substrate, for reading out, as shot image signals, signals corresponding to signal charge amounts detected by the photoelectric conversion film according to incident light quantities. The manufacturing method is characterized by comprising the steps of bonding a collective transparent substrate, with a transparent resin, to a layer that is disposed on the light incidence side of a semiconductor wafer which has the same area as the collective transparent substrate and is a collection of plural semiconductor substrates in each of which a photoelectric conversion film and signal reading means are formed; and dicing a resulting structure into individual assemblies of a semiconductor substrate and a transparent substrate.

The manufacturing method according to another embodiment is directed to a photoelectric conversion film-stacked solid-state imaging device without microlenses having a semiconductor substrate, a photoelectric conversion film stacked on a layer that is disposed on the light incidence side of the semiconductor substrate, and signal reading means formed in a surface portion of the semiconductor substrate, for reading out, as shot image signals, signals corresponding to signal charge amounts detected by the photoelectric conversion film according to incident light quantities. The manufacturing method is characterized by comprising the steps of bonding transparent substrates, with a transparent resin, to layers that are disposed on the light incidence side of respective good semiconductor substrates of a semiconductor wafer which is a collection of plural semiconductor substrates in each of which a photoelectric conversion film and signal reading means are formed; and dicing the semiconductor wafer to produce individual assemblies of a good semiconductor substrate and a transparent substrate.

The manufacturing method according to still another embodiment is directed to a photoelectric conversion film-stacked solid-state imaging device without microlenses having a semiconductor substrate, a photoelectric conversion film stacked on a layer that is disposed on the light incidence side of the semiconductor substrate, and signal reading means formed in a surface portion of the semiconductor substrate, for reading out, as shot image signals, signals corresponding to signal charge amounts detected by the photoelectric conversion film according to incident light quantities. The manufacturing method is characterized by comprising the steps of bonding a thick transparent resin to a layer that is disposed on the light incidence side of a semiconductor wafer which is a collection of plural semiconductor substrates in each of which a photoelectric conversion film and signal reading means are formed; setting the transparent resin; and dicing a resulting structure into individual assemblies of a semiconductor substrate and a transparent resin member.

The manufacturing method according to a further embodiment is directed to a photoelectric conversion film-stacked solid-state imaging device without microlenses having a semiconductor substrate, a photoelectric conversion film stacked on a layer that is disposed on the light incidence side of the semiconductor substrate, and signal reading means formed in a surface portion of the semiconductor substrate, for reading out, as shot image signals, signals corresponding to signal charge amounts detected by the photoelectric conversion film according to incident light quantities. The manufacturing method is characterized by comprising the steps of bonding layers that are disposed on the light incidence side of plural respective semiconductor substrates in each of which a photoelectric conversion film and signal reading means are formed to a collective transparent substrate with a transparent resin; and dicing the collective transparent substrate to produce individual assemblies of a semiconductor substrate and a transparent substrate.

The manufacturing method just described above is also characterized in further comprising the step, executed after the bonding step, of filling spaces between the adjoining semiconductor substrates with resin, and in that the dicing step dices a resulting structure at the resin members into assemblies of a semiconductor substrate, a transparent substrate, and resin members.

The manufacturing method just described above is also characterized in that the resin is an optical black resin.

The photoelectric conversion film-stacked solid-state imaging device without microlenses according to each embodiment is characterized by being manufactured by one of the above manufacturing methods.

The imaging apparatus according to each embodiment is characterized by comprising one of the above photoelectric conversion film-stacked solid-state imaging device without microlenses.

As such, the embodiment makes it possible to manufacture a compact and thin solid-state imaging device which has such a device structure as to be high in mass-productivity, which is highly reliable because of no hollow spaces, and which is increased in reliability because of the structure that prevents dust etc. the like from entering the solid-state imaging device 100 and reaching the photodetecting surface of the imaging device chip 101.

Being compact and thin and high in mass-productivity and reliability, the photoelectric conversion film-stacked solid-state imaging device without microlenses according to the invention is useful when incorporated in a digital still camera, a digital video camera, a camera-incorporated cell phone, a camera-incorporated electronic apparatus, a monitoring camera, an endoscope, a vehicular camera, etc.

What is claimed is:

1. A photoelectric conversion film-stacked solid-state imaging device without microlenses, comprising:
    a semiconductor substrate;
    a photoelectric conversion film stacked on a layer that is disposed on the light incidence side of the semiconductor substrate;
    a signal reading unit formed in a surface portion of the semiconductor substrate, for reading out, as shot image signals, signals corresponding to signal charge amounts detected by the photoelectric conversion film according to incident light quantities;
    a transparent substrate bonded to a layer that is disposed on the light incidence side of the photoelectric conversion film with a transparent resin as an adhesive; and
    an electric connection terminal which is connected to the signal reading unit by interconnections and which is as a whole embedded in the semiconductor substrate and only penetrates through the semiconductor substrate and is only exposed in a surface, located on the opposite side to the side where the photoelectric conversion film is provided, of the semiconductor substrate.

2. The photoelectric conversion film-stacked solid-state imaging device without microlenses according to claim 1, wherein a distance between a front surface of the transparent substrate and the surface of the semiconductor substrate in which the electric connection terminals are exposed is equal to a total thickness of the solid-state imaging device.

3. The photoelectric conversion film-stacked solid-state imaging device without microlenses according to claim 1, wherein the transparent substrate and the semiconductor substrate have the same area.

4. The photoelectric conversion film-stacked solid-state imaging device without microlenses according to claim 3, wherein the transparent resin is made thick to replace the transparent substrate.

5. The photoelectric conversion film-stacked solid-state imaging device without microlenses according to claim 1, wherein the transparent substrate has a smaller area than the semiconductor substrate.

6. The photoelectric conversion film-stacked solid-state imaging device without microlenses according to claim 5, further comprising resin members with which spaces are filled that are adjacent to steps that are formed because of the difference between the areas of the transparent substrate and the semiconductor substrate, whereby the solid-state imaging device has a complete rectangular parallelepiped shape.

7. The photoelectric conversion film-stacked solid-state imaging device without microlenses according to claim 1, wherein the transparent substrate has a larger area than the semiconductor substrate.

8. The photoelectric conversion film-stacked solid-state imaging device without microlenses according to claim 1, wherein side surfaces of the solid-state imaging device are coated in black.

9. An imaging apparatus comprising the photoelectric conversion film-stacked solid-state imaging device without microlenses according to claim 1.

10. A manufacturing method of a photoelectric conversion film-stacked solid-state imaging device without microlenses having a semiconductor substrate, a photoelectric conversion film stacked on a layer that is disposed on the light incidence side of the semiconductor substrate, a signal reading unit formed in a surface portion of the semiconductor substrate, for reading out, as shot image signals, signals corresponding to signal charge amounts detected by the photoelectric conversion film according to incident light quantities, and an electric connection terminal which is connected to the signal reading unit by interconnections and which is as a whole embedded in the semiconductor substrate and only penetrates through the semiconductor substrate and is only exposed in a surface, located on the opposite side to the side where the photoelectric conversion film is provided, of the semiconductor substrate, comprising the steps of:
bonding a collective transparent substrate, with a transparent resin, to a layer that is disposed on the light incidence side of a semiconductor wafer which has the same area as the collective transparent substrate and is a collection of plural semiconductor substrates in each of which a photoelectric conversion film and a signal reading unit are formed; and
dicing a resulting structure into individual assemblies of a semiconductor substrate and a transparent substrate.

11. A photoelectric conversion film-stacked solid-state imaging device without microlenses manufactured by the manufacturing method according to claim 10.

12. An imaging apparatus comprising the photoelectric conversion film-stacked solid-state imaging device without microlenses according to claim 11.

13. A manufacturing method of a photoelectric conversion film-stacked solid-state imaging device without microlenses having a semiconductor substrate, a photoelectric conversion film stacked on a layer that is disposed on the light incidence side of the semiconductor substrate, a signal reading unit formed in a surface portion of the semiconductor substrate, for reading out, as shot image signals, signals corresponding to signal charge amounts detected by the photoelectric conversion film according to incident light quantities and an electric connection terminal which is connected to the signal reading unit by interconnections and which is as a whole embedded in the semiconductor substrate and only penetrates through the semiconductor substrate and is only exposed in a surface, located on the opposite side to the side where the photoelectric conversion film is provided, of the semiconductor substrate, comprising the steps of:
bonding transparent substrates, with a transparent resin, to layers that are disposed on the light incidence side of respective non-defective semiconductor substrates of a semiconductor wafer which is a collection of plural semiconductor substrates in each of which a photoelectric conversion film and the signal reading unit are formed; and
dicing the semiconductor wafer to produce individual assemblies of a non-defective semiconductor substrate and a transparent substrate.

14. A manufacturing method of a photoelectric conversion film-stacked solid-state imaging device without microlenses having a semiconductor substrate, a photoelectric conversion film stacked on a layer that is disposed on the light incidence side of the semiconductor substrate, a signal reading unit formed in a surface portion of the semiconductor substrate, for reading out, as shot image signals, signals corresponding to signal charge amounts detected by the photoelectric conversion film according to incident light quantities and an electric connection terminal which is connected to the signal reading unit by interconnections and which is as a whole embedded in the semiconductor substrate and only penetrates through the semiconductor substrate and is only exposed in a surface, located on the opposite side to the side where the photoelectric conversion film is provided, of the semiconductor substrate, comprising the steps of:
bonding a thick transparent resin to a layer that is disposed on the light incidence side of a semiconductor wafer which is a collection of plural semiconductor substrates in each of which a photoelectric conversion film and the signal reading unit are formed;
setting the transparent resin; and
dicing a resulting structure into individual assemblies of a semiconductor substrate and a transparent resin member.

15. A manufacturing method of a photoelectric conversion film-stacked solid-state imaging device without microlenses having a semiconductor substrate, a photoelectric conversion film stacked on a layer that is disposed on the light incidence side of the semiconductor substrate, a signal reading unit formed in a surface portion of the semiconductor substrate, for reading out, as shot image signals, signals corresponding to signal charge amounts detected by the photoelectric conversion film according to incident light quantities and an electric connection terminal which is connected to the signal reading unit by interconnections and which is as a whole embedded in the semiconductor substrate and only penetrates through the semiconductor substrate and is only exposed in a surface, located on the opposite side to the side where the photoelectric conversion film is provided, of the semiconductor substrate, comprising the steps of:

bonding layers that are disposed on the light incidence side of plural respective semiconductor substrates in each of which a photoelectric conversion film and the signal reading unit are formed to a collective transparent substrate with a transparent resin; and dicing the collective transparent substrate to produce individual assemblies of a semiconductor substrate and a transparent substrate.

16. The manufacturing method according to claim 15, further comprising the step, executed after the bonding step, of filling spaces between the adjoining semiconductor substrates with resin, wherein the dicing step dices a resulting structure at the resin members into assemblies of a semiconductor substrate, a transparent substrate, and resin members.

17. The manufacturing method according to claim 16, wherein the resin is an optical black resin.

* * * * *